(12) United States Patent
Berg

(10) Patent No.: US 8,787,598 B2
(45) Date of Patent: Jul. 22, 2014

(54) DYNAMIC CONTOURED-SOUND/SUBWOOFER-SYNTHESIS AUDIO SYSTEM

(75) Inventor: Paul G. Berg, Scottsdale, AZ (US)

(73) Assignee: Paul G. Berg, Peoria, AZ (US)

( * ) Notice: Subject to any disclaimer, the term of this patent is extended or adjusted under 35 U.S.C. 154(b) by 1135 days.

(21) Appl. No.: 12/471,427

(22) Filed: May 25, 2009

(65) Prior Publication Data

US 2009/0290728 A1    Nov. 26, 2009

Related U.S. Application Data

(60) Provisional application No. 61/056,040, filed on May 26, 2008.

(51) Int. Cl.
*H03F 99/00* (2009.01)
*H03F 1/26* (2006.01)

(52) U.S. Cl.
USPC .......................................... 381/121; 330/149

(58) Field of Classification Search
USPC .......................................... 381/121; 330/149
See application file for complete search history.

(56) References Cited

U.S. PATENT DOCUMENTS

2004/0071297 A1* 4/2004 Katou et al. .................... 381/61

* cited by examiner

*Primary Examiner* — Steven J Fulk

(57) ABSTRACT

A dynamic sound enhancement system and method which produces non-linear dynamic gain, time domain offset, and damping control in relation to frequency components of an applied audio signal. The functions and characteristics of the system make it feasible to extend the ability of small speakers to distinctly reproduce natural low frequencies including bass and sub-bass frequencies concurrently with high frequencies. Further, the system provides customization of system characteristics for obtaining optimized sound quality, audibility, and sound perception from diverse sound producing devices, and which satisfies diverse user hearing needs and listening preferences.

11 Claims, 6 Drawing Sheets

DYNAMIC CONTOURED-SOUND/SUBWOOFER-SYNTHESIS AUDIO SYSTEM

CROSS-REFERENCE TO RELATED APPLICATION

This application claims the benefit of U.S. Provisional Patent Application Ser. No. 61/056,040, filed 26 May 2008.

FIELD OF THE INVENTION

This invention generally relates to signal conditioning in audio systems.

BACKGROUND OF THE INVENTION

Research has shown that the response of the human ear is very dependent on the frequency content of the sound. The ear has peak response around 2,000 Hz to 4,000 Hz and significantly less response at lower and higher frequencies. In other words, a sound with a frequency between 2,000 Hz and 4,000 Hz will be perceived as louder to the ear than sounds below and above this range. Additionally, the ear's ability to perceive low and high frequencies varies with sound intensity (i.e., volume) level. This explains why soft music seems to sound less rich than music played at higher volume. Turning to FIG. 1, each curve represents a different volume level from a sound source, such as a stereo system. Curves on the bottom represent quieter volume levels and curves on the top represent louder volume levels. By examining these curves it will be observed that the quieter a volume level the greater the difference in sound intensity level (sound energy) required for the ear to hear low and high frequencies. Thus, it is desirable for a sound system to compensate for the natural inadequacies of the ear.

Furthermore, the ability of a typical speaker to reproduce sound diminishes (rolls-off) at low and high frequencies resulting in a reduction of sound content conveyed to the ear. A significant reduction of sound intensity occurs as the signal frequency decreases from 700 Hz down to 20 Hz and again as the frequency increases from 4,000 Hz to 20,000 Hz. See for example the typical speaker frequency response illustrated graphically in FIG. 2. This roll-off results in diminished loudness and thus audibility as perceived by the human ear.

One method/apparatus of solving the low frequency problem in the prior art, is to provide a subwoofer system. Subwoofer systems, specifically designed to accentuate lower frequencies, are incorporated with standard stereo systems to compensate for the low frequency roll-off. A major problem is that commonly obtainable audio subwoofer systems for reproducing low frequency sound are constructed in such an embodiment that their form is bulky and therefore cannot be easily transported for personal use, for example with a portable media player when walking or exercising. Additionally, commercially obtainable subwoofer systems consume sizeable electrical power, require ventilation for heat removal, can be complex and difficult to connect and operate, are costly to obtain, present a potential for electrical shock when exposed in damp or wet environments, and as a result are not able to be proliferated widely or easily.

A further method of solving the low frequency problem in the prior art, is to remove or diminish the magnitude of low frequency sounds and replace them with harmonics of the natural frequency providing a virtual simulation of the natural low frequency.

A major problem is that natural low frequencies near or below 50 HZ (i.e. Sub-Bass frequencies) have desirable characteristics, such as the ability to convey physical sensation (feeling). Many sound effects used in movies, video games, and music genre's fall into this frequency range including; explosions, earthquakes, crashes, gunfire, and electronically produced deep bass musical tones and rhythms. Therefore, removing or diminishing these frequencies results in an incomplete audio reproduction experience.

To date, audio engineers have been unable to produce extreme low frequency sound (i.e., in the bass and sub-bass range, 50-250 Hz and below 50 Hz respectively) from all speaker and earpiece types of sound devices. In fact, it is commonly believed by audio engineers that it is physically impossible to produce extreme low frequency sound with small speakers and other audio sound devices.

It would be highly advantageous, therefore, to remedy the foregoing and other deficiencies inherent in the prior art.

Accordingly, it is an object of the present invention to provide a new and improved low frequency sound enhancement system.

It is a further object of the present invention to provide a new and improved dynamic sound enhancement system that substantially compensates for the natural inadequacy of the human ear at either or both the low frequencies and the high frequencies.

It is a further object of the present invention to provide a new and improved dynamic sound enhancement system that substantially compensates for the roll-off effects of standard speakers and other sound producing devices.

It is a further object of the present invention to provide a new and improved dynamic sound enhancement system that is capable of being used with substantially any sound producing devices, including speakers, small speakers, earpieces, hearing aids, etc.

SUMMARY OF THE INVENTION

Briefly, to achieve the desired objects of the instant invention in accordance with a preferred system thereof, provided is a dynamic sound enhancement system that can provide improved sound quality, audibility, and sound perception from sound producing devices.

A first aspect of the instant invention provides a low frequency adjustment sub-system designed to provide a variety of low frequency responses in response to adjustments of an adjustable element.

A second aspect of the instant invention provides an adjustable high frequency adjustment sub-system designed to provide a variety of high frequency responses in response to adjustments of an adjustable element.

A third aspect of the instant invention provides an integration and gain sub-system designed to integrate a variety of input signals, invert the composite signal polarity, produce low and high frequency gain and signal-shaping.

A fourth aspect of the instant invention provides a low frequency feedback control sub-system for controlling the bandwidth and magnitude of low frequency feedback signals.

A fifth aspect of the instant invention provides a band pass feedback control sub-system for attenuating and conveying all applied feedback frequencies to the input of the integration and gain subsystem, contributing to the regulation of system dynamic gain.

A sixth aspect of the instant invention provides a low frequency damping sub-system for controlling the magnitude and shape of low frequency output signals.

A seventh aspect of the instant invention provides a high frequency damping sub-system for controlling the magnitude and shape of high frequency output signals.

An eighth aspect of the instant invention provides a low frequency phase offset sub-system for controlling low frequency feedback time differential.

A ninth aspect of the instant invention provides a high frequency phase offset sub-system for controlling high frequency feedback time differential.

The desired objects of the instant invention are further realized in accordance with a method of low frequency sound enhancement in a sound producing device including the step of applying an input audio signal to the low frequency adjustment sub-system to select a preferred audio response frequency for controlling the bandwidth and magnitude of low frequency input signals.

The method further includes the step of applying the preferred audio frequencies from the low frequency adjustment sub-system to the input of the integration and gain sub-system for integrating concurrently arriving signals, inverting of the composite signal polarity and controlling the magnitude of preferred frequencies.

The method further includes the step of applying audio signals from the output of the integration and gain sub-system to the low frequency feedback control sub-system for controlling the bandwidth and magnitude of low frequency feedback signals.

The method further includes the step of applying the preferred audio frequencies from the output of the low frequency feedback control sub-system, to the low frequency phase offset sub-system for offsetting the time of delivery of preferred audio frequencies in relation to the time of delivery of non-preferred audio frequencies to the input of the integration and gain sub-system.

The method further includes the step of receiving the preferred audio frequencies from the low frequency phase offset sub-system by the input of the integration and gain sub-system for controlling the gain of low frequency output signals.

The method further includes the step of applying the audio signals from the output of the integration and gain sub-system to the low frequency damping sub-system for further controlling of the magnitude and shape of low frequency output signals.

The desired objects of the instant invention are further realized in accordance with a method of high frequency sound enhancement in a sound producing device including the step of applying audio signals from the output of the integration and gain sub-system to the high frequency adjustment sub-system to select a preferred audio cutoff frequency for controlling the bandwidth and magnitude of high frequency feedback signals.

The method further includes the step of applying preferred audio signals from the output of the high frequency adjustment sub-system to the high frequency damping sub-system for further controlling of the magnitude and shape of high frequency output signals.

The method further includes the step of applying audio signals from the output of the high frequency damping sub-system to the high frequency phase offset sub-system for offsetting the time of delivery of preferred audio frequencies in relation to the time of delivery of non-preferred audio frequencies to the input of the integration and gain sub-system.

The method further includes the step of receiving the preferred audio frequencies from the high frequency phase offset sub-system by the input of the integration and gain sub-system for controlling the gain of high frequency output signals.

The desired objects of the instant invention are further realized in accordance with a method of low and high frequency sound enhancement in a sound producing device including the step of applying audio signals from the output of the integration and gain sub-system to the band pass feedback control sub-system for attenuating and conveying all applied feedback frequencies to the input of the integration and gain sub-system and contributing to the regulation of system dynamic gain.

The method further includes the step of applying the preferred audio signals from the low frequency phase offset sub-system, the high frequency phase offset sub-system, and the band pass feedback control sub-system to the input of the integration and gain sub-system.

The method thereby provides dynamic gain in relation to frequencies encompassed within the applied audio signal that substantially compensates for the roll-off effects of sound producing devices at low audio frequencies and at high audio frequencies.

The method further counterbalances the natural inadequacies of the human ear and significantly compensates the ear's ability to perceive low and high frequency sounds.

The method further extends the ability of small speakers to reproduce natural low frequencies including bass and sub-bass frequencies.

The method further presents preferred frequencies to the human ear at offset time intervals creating the perception of added loudness, spaciousness, and image broadening.

The method further provides adjustability encompassing the selection of preferred low and high audio frequencies, corresponding magnitudes of dynamic gain and phase offset, providing customization of system performance for obtaining optimized sound quality, audibility, and sound perception from sound producing devices, and to satisfy a variety of user needs and preferences.

BRIEF DESCRIPTION OF THE DRAWINGS

The foregoing and further and more specific objects and advantages of the instant invention will become readily apparent to those skilled in the art from the following detailed description of a preferred system and method thereof taken in conjunction with the drawings, in which.

DETAILED DESCRIPTION OF A PREFERRED EMBODIMENT

Figure 3:
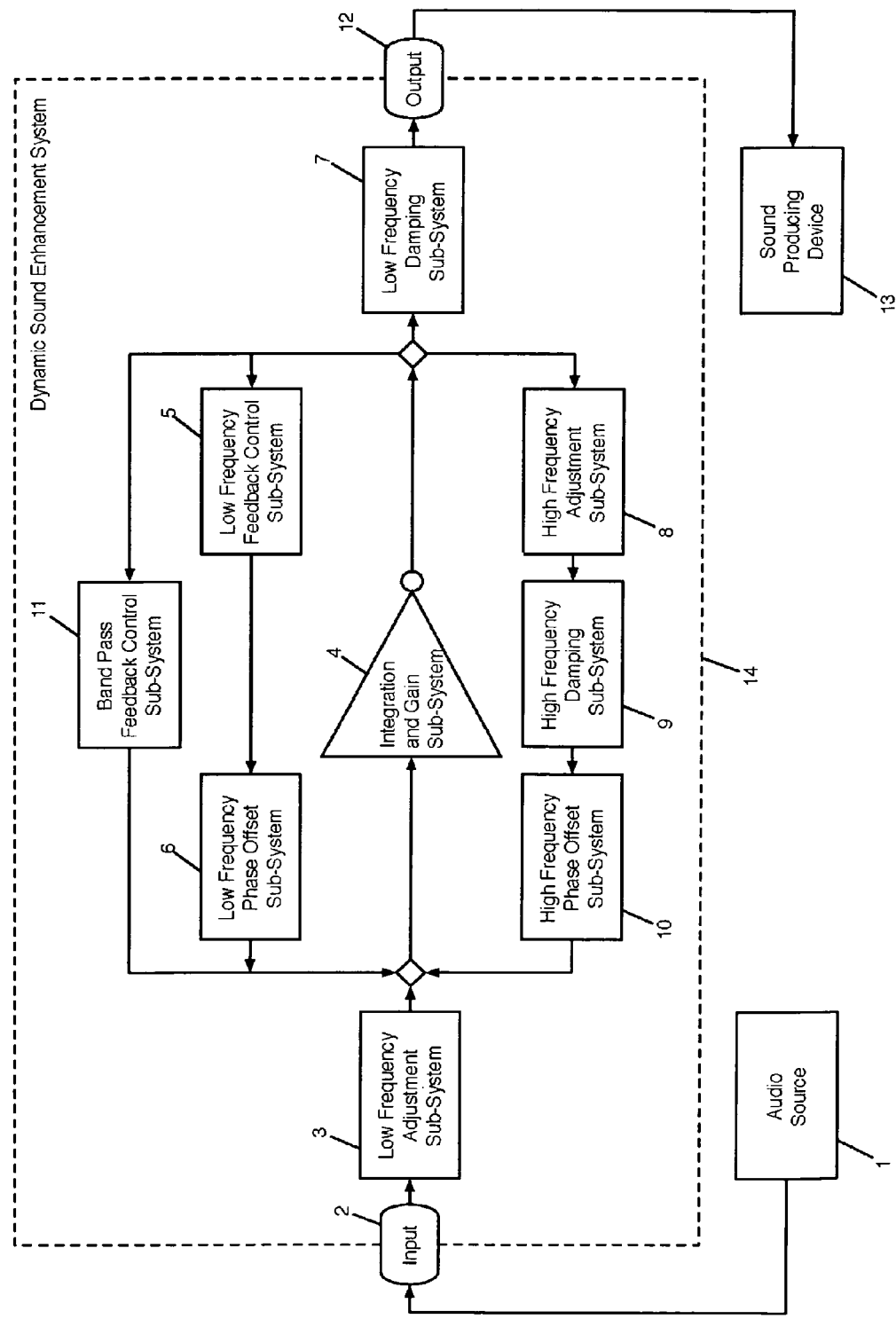
FIG. 3 is a block diagram representation of one embodiment of a dynamic sound enhancement system in accordance with the present invention.

Turning now to FIG. 3, a block diagram representation is illustrated of one embodiment of a dynamic sound enhancement system, designated 14, in accordance with the present invention. Sound system 14 receives an audio signal from an audio source 1 at an input terminal 2 which conveys the audio signal to a low frequency adjustment sub-system 3. The low frequency adjustment sub-system 3 provides a variety of low frequency responses in response to adjustments of an adjustable element. The adjustable element is constructed with a plurality of step settings and each setting produces a different low frequency response at its output.

An integration and gain control sub-system 4 integrates feedback signals from the low frequency phase offset sub-system 6, the band pass feedback control sub-system 11, and the high frequency phase offset sub-system 10 with arriving input signals, inverts the resulting composite signal polarity, adjusts the magnitude of the composite signal, and conveys the processed signal to its output.

A low frequency feedback control sub-system 5 provides low frequency responses in relation to applied frequency determining the bandwidth and magnitude of low frequency feedback signals conveyed to the input of the gain subsystem 4 in relation to their frequency. This sub-system in combination with the band pass sub-system 11 and low frequency adjustment sub-system 3 regulate the signal magnitude of bass and sub-bass frequencies presented at the output of the integration and gain sub-system 4.

Figure 4:
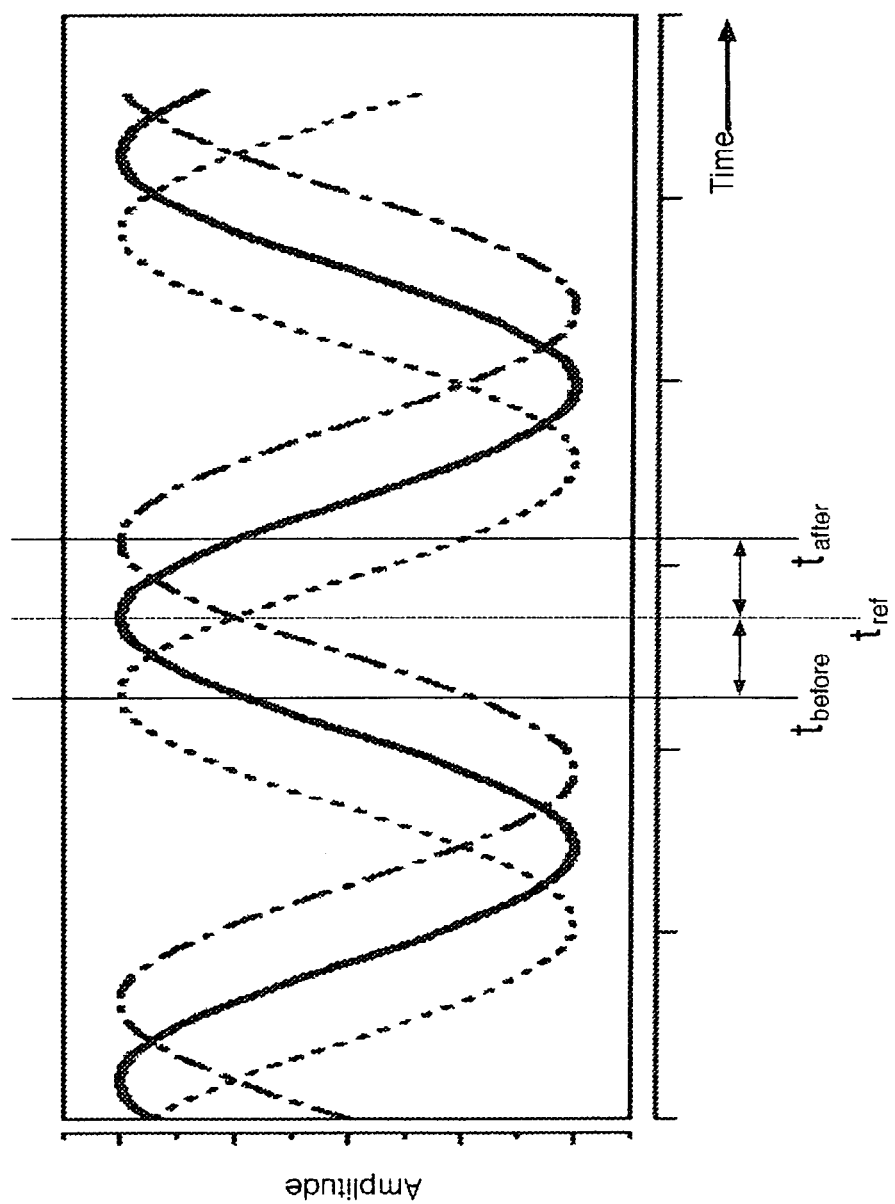
FIG. 4 is a graphical representation of low and high frequency phase offset produced by the low frequency phase offset, and high frequency phase offset sub-system blocks of FIG. 3.

A low frequency phase offset sub-system 6 provides variable plus and minus feedback time offsets for preferred bass frequencies in relation to non-preferred frequencies. The time offsets encompass up to several milliseconds of time and occur before (plus offset) and after (minus offset) by comparison with non-preferred feedback frequencies as shown in FIG. 4.

A band pass feedback control subsystem 11 provides a broad pass frequency response while concurrently attenuating the magnitude of applied feedback frequencies to the gain sub-system 4, contributing to the regulation of system dynamic gain.

Figure 5:
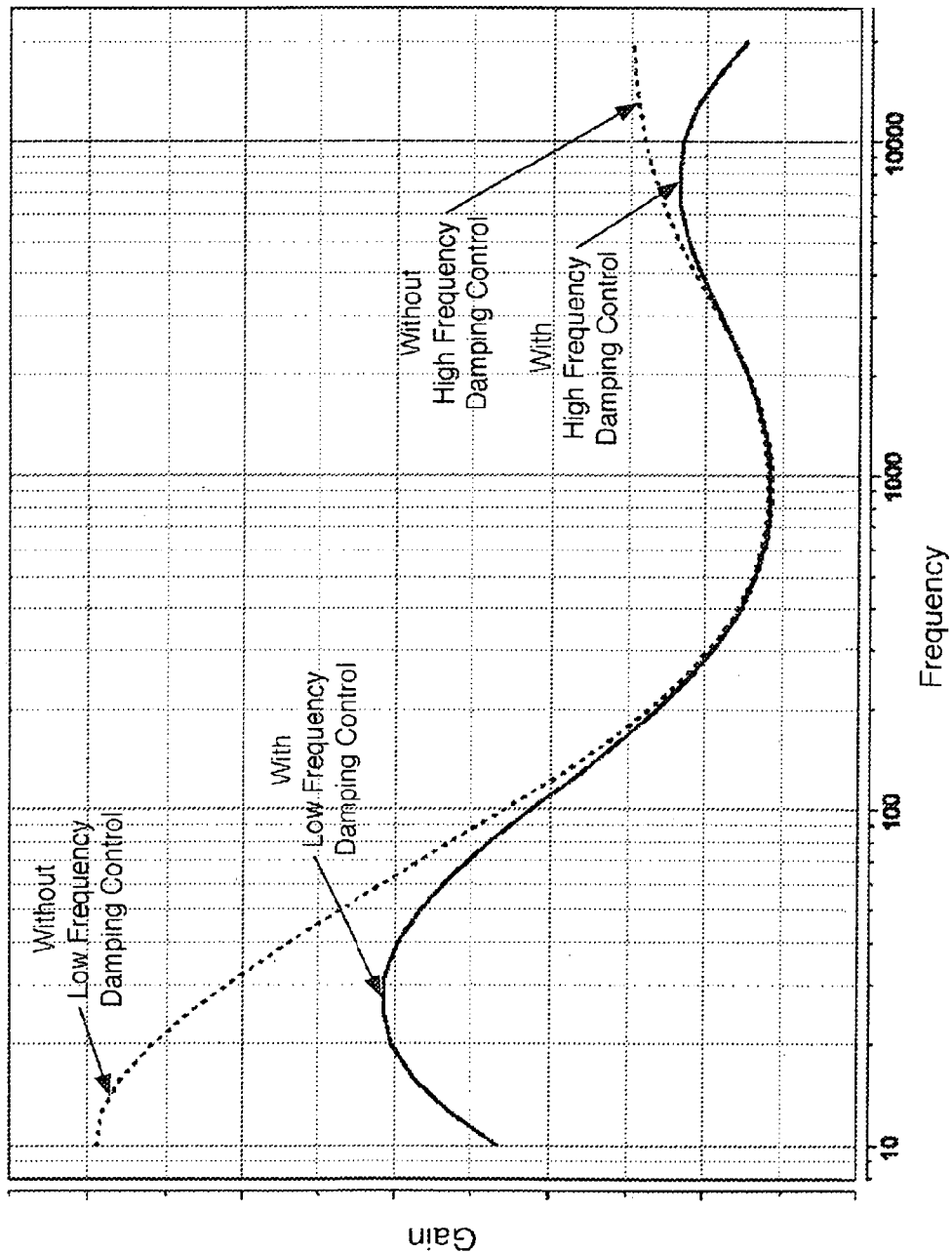
FIG. 5 is a graphical representation of the audio signal damping produced by the low and high frequency damping sub-system blocks of FIG. 3.

A low frequency damping subsystem 7 provides supplementary regulation of the magnitude and shape of low frequency output signals for controlling sound producing device distortion artifacts (e.g. excess speaker diaphragm displacement and speaker resonance). As shown in FIG. 5, the low frequency damping sub-system 7 provides a controlled decay of the output signal magnitude after the signal reaches a threshold gain determined in conjunction with a setting of the low frequency adjustment sub-system 3.

A high frequency adjustment sub-system 8 provides a variety of high frequency responses in response to adjustments of an adjustable element. The adjustable element is constructed with a plurality of step settings and each setting produces a different high frequency response at its output.

A high frequency damping subsystem 9 provides supplementary regulation of the magnitude and shape of high frequency output signals for controlling sound producing device distortion artifacts (e.g. excess speaker diaphragm displacement and resonance). As shown in FIG. 5, the high frequency damping sub-system 9 provides a controlled decay of the output signal magnitude after the signal reaches a threshold gain defined in conjunction with a setting of the high frequency adjustment sub-system 8.

A high frequency phase offset sub-system 10 provides variable plus and minus feedback time offsets for preferred treble frequencies in relation to non-preferred frequencies. The time offsets encompass up to several milliseconds of time and occur before (plus offset) and after (minus offset) by comparison with non-preferred feedback frequencies as shown in FIG. 4.

Figure 1:
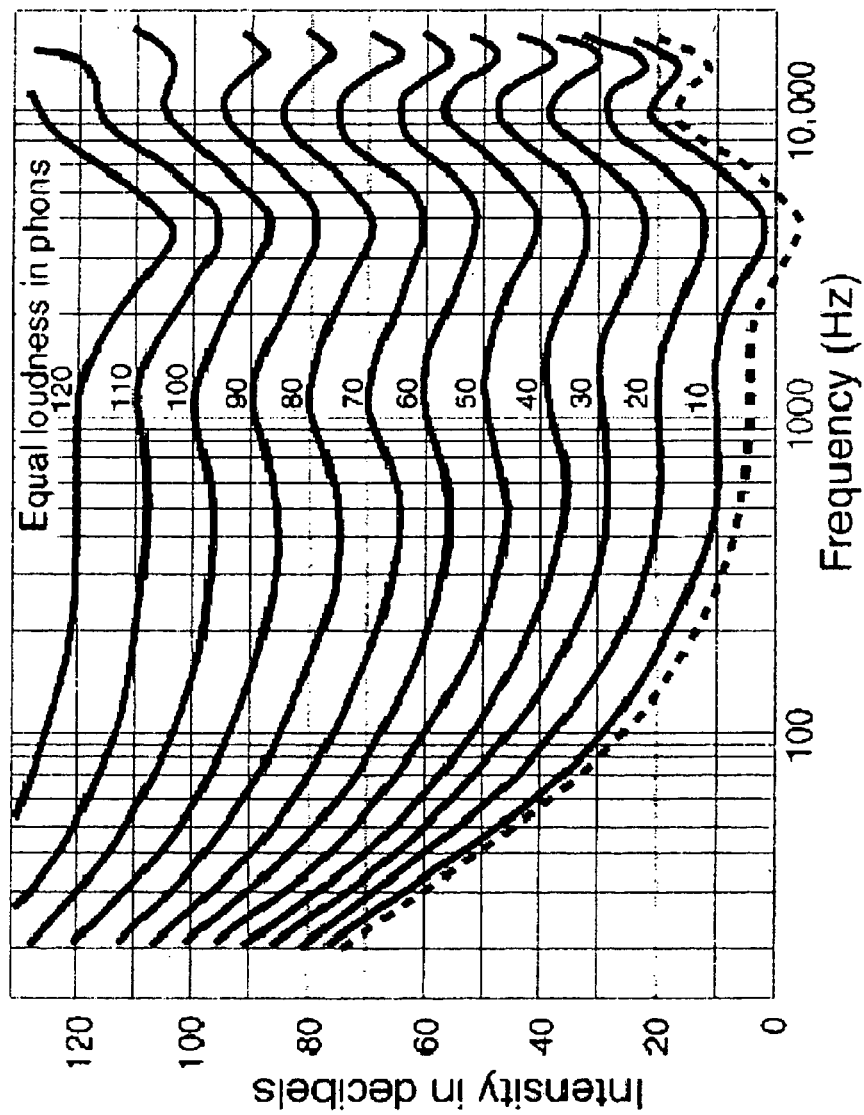
FIG. 1 is a graphical representation of the natural response of the human ear, each curve in the graph representing a different volume level from a sound source such as a stereo system.
Figure 2:
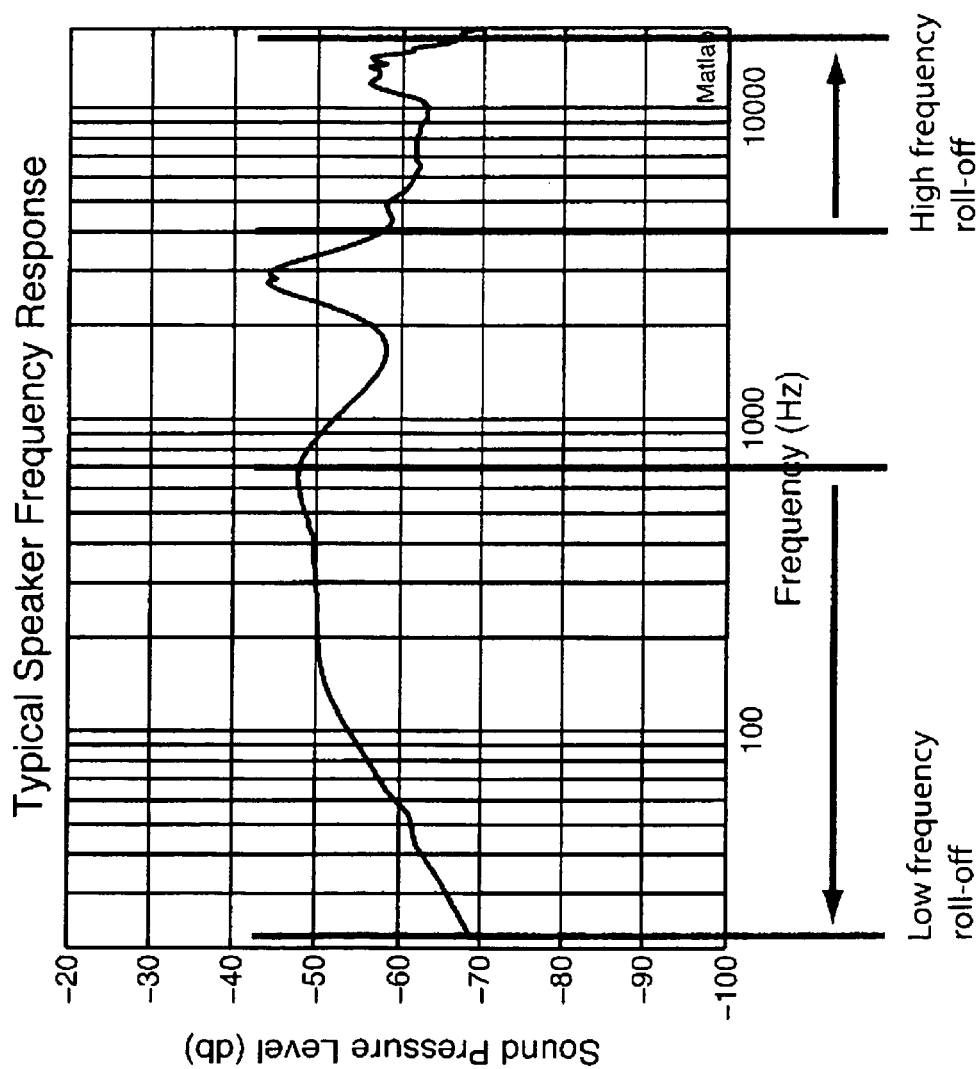
FIG. 2 is a graphical representation of the frequency response of a typical speaker.
Figure 6:
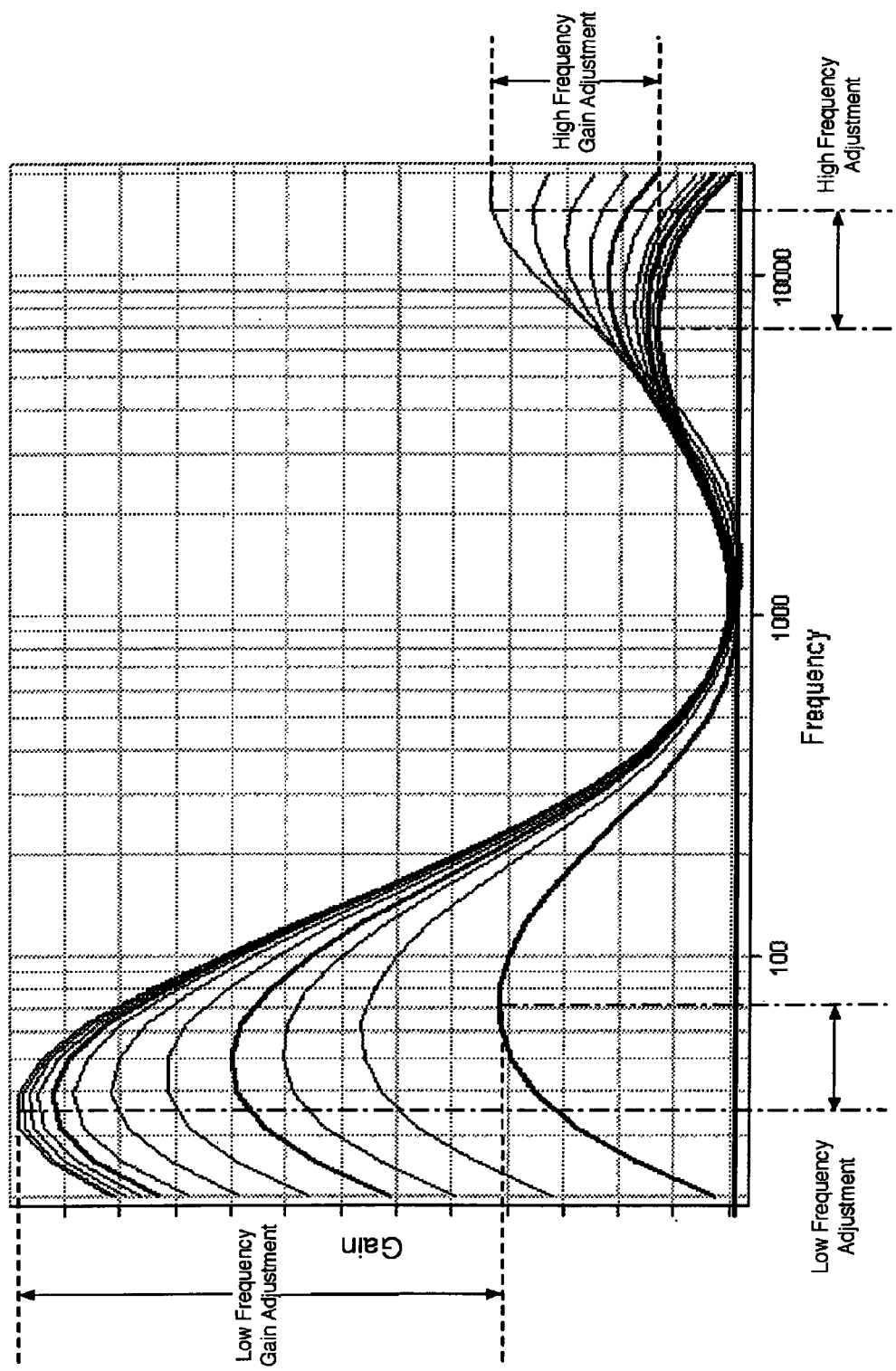
FIG. 6 is a graphical representation of the low and high range frequency and gain responses of the low and high frequency adjustment sub-system blocks of FIG. 3, illustrating the adjustability and response provided.

The composite dynamic sound enhancement system 14 produces dynamic signal gain as shown in FIG. 6 in relation to frequency composition of the applied audio signal. Further, the composite dynamic sound enhancement system 14 provides adjustability encompassing the selection of preferred low and high audio frequencies, corresponding magnitudes of dynamic gain as shown in FIG. 2, and phase offset as shown in FIG. 4. providing customization of system characteristics for satisfying diverse sound enhancement applications.

Thus, a dynamic sound enhancement system has been disclosed that provides dynamic signal gain in relation to frequency composition of the applied audio signal that substantially compensates for the roll-off effects of sound producing devices at low audio frequencies and at high audio frequencies. Further, the dynamic sound enhancement system counterbalances the natural inadequacies of the human ear and significantly compensates the ear's ability to perceive low and high frequency sounds. Further, the dynamic sound enhancement system extends the ability of small speakers to reproduce natural low frequencies including bass and sub-bass frequencies. Further, the dynamic sound enhancement system presents preferred frequencies to the human ear at offset time intervals creating a perception of added loudness, spaciousness, and image broadening. Further, the dynamic sound enhancement system provides customization of system characteristics for obtaining optimized sound quality, audibility, and sound perception from diverse sound producing devices, and which satisfies diverse user hearing needs and listening preferences.

Various changes and modifications to the embodiment herein chosen for purposes of illustration will readily occur to those skilled in the art. To the extent that such modifications and variations do not depart from the spirit of the invention, they are intended to be included within the scope of the invention which is assessed only by a fair interpretation of the following claims.

Having fully described the invention in clear and concise terms as to enable those skilled in the art to understand and practice the same, the invention claimed is:

1. A dynamic sound enhancement system that produces extreme low frequency sound, in the bass and sub-bass range, 50-250 Hz and below 50 Hz respectively, from all speaker and earpiece types including standard speakers, small speakers, personal earpieces, and hearing aids, that substantially compensates for the natural inadequacy of the human ear at both low and high frequencies, below 250 Hz and above 10,000 Hz respectively, and that substantially compensates for the frequency roll-off effects of standard speakers and other sound producing devices, comprising:

a low frequency adjustment sub-system operable to provide a variety of low frequency responses in response to adjustments of an adjustable element, embodied with a plurality of step settings, each setting producing a different low frequency response thus allowing or preventing preferred low frequencies from reaching the system gain sub-system;

a gain sub-system operable to invert input signal polarity, adjust the magnitude of applied frequencies dynamically, integrate feedback signals from other sub-systems with newly arriving input signals concurrently and present the resulting composite signal at its output;

a low frequency feedback control sub-system operable to provide low frequency responses in relation to applied frequency thereby determining the bandwidth and magnitude of low frequency feedback signals applied to the input of the gain subsystem and contributing to regulation of bass and sub-bass frequency signal magnitude at the gain sub-system output;

a low frequency phase offset sub-system operable to provide variable plus and minus feedback time offsets for preferred bass frequencies in relation to non-preferred frequencies embodied to produce time offsets encompassing up to several milliseconds of time which occur before (plus offset) and after (minus offset) in relation to non-preferred feedback frequencies;

a band pass feedback control subsystem operable to provide a broad pass frequency band while concurrently attenuating the magnitude of applied feedback frequencies prior to conveying those frequencies to the gain sub-system thereby contributing to the regulation of system dynamic gain;

a low frequency damping subsystem operable to provide supplementary regulation of the magnitude and shape of low frequency output signals thereby controlling sound producing device distortion artifacts by the method of controlling decay rate of the final output signal magnitude after the signal reaches a threshold gain defined in conjunction with a setting of the low frequency adjustment sub-system;

a high frequency adjustment sub-system operable to provide a variety of high frequency responses in response to adjustments of an adjustable element, embodied with a plurality of step settings, each setting producing a different high frequency cutoff thus allowing or preventing preferred high frequencies from reaching the system gain sub-system;

a high frequency damping subsystem operable to provide supplementary regulation of the magnitude and shape of high frequency output signals thereby controlling sound producing device distortion artifacts by the method of controlling decay rate of the final output signal magnitude after the signal reaches a threshold gain defined in conjunction with a setting of the high frequency adjustment sub-system, and a high frequency phase offset sub-system operable to provide variable plus and minus feedback time offsets for preferred treble frequencies in relation to non-preferred frequencies embodied to produce time offsets encompassing up to several milliseconds of time which occur before (plus offset) and after (minus offset) in relation to non-preferred feedback frequencies.

2. The dynamic sound enhancement system of claim 1, wherein dynamic signal gain is produced in relation to frequency composition of the applied audio signal.

3. The dynamic sound enhancement system of claim 1, wherein dynamic signal gain is a non-linear function of applied audio signal frequency composition.

4. The dynamic sound enhancement system of claim 1, wherein audio signals applied at the system input concurrently are, in relation to frequency, offset in time and presented at the system output at non-concurrent intervals of several milliseconds.

5. The dynamic sound enhancement system of claim 1, wherein bass and sub-bass audio signal frequencies presented at the system output are damped by controlled decay of the output signal magnitude.

6. The dynamic sound enhancement system of claim 1, wherein treble audio signal frequencies presented at the system output are damped by controlled decay of the output signal magnitude.

7. The dynamic sound enhancement system of claim 1, wherein preferred low and high audio frequencies, corresponding magnitudes of dynamic gain and phase offset, are adjustable by user control producing customizable system characteristics.

8. A dynamic sound enhancement method that produces extreme low frequency sound, in the bass and sub-bass range, 50-250 Hz and below 50 Hz respectively, from all speaker and earpiece types including standard speakers, small speakers, personal earpieces, and hearing aids, that substantially compensates for the natural inadequacy of the human ear at both low and high frequencies, below 250 Hz and above 10,000 Hz respectively, and that substantially compensates for the frequency roll-off effects of standard speakers and other sound producing devices, comprising:

reducing magnitude of low frequency components encompassed within a composite audio input signal based on preferential low frequency sound enhancement characteristics;

inverting polarity of said audio input signal and;

increasing its magnitude by an amount proportional with preferential sound enhancement and sound producing device characteristics;

attenuating the magnitude of the increased magnitude-inverted polarity signal proportional with preferential sound enhancement and sound producing device characteristics and;

integrating the attenuated signal with newly arriving audio signals which have completed the first step of this claim;

continuously repeating the methodology of the prior four steps.

9. The dynamic sound enhancement method of claim 8, wherein;

reducing magnitude of low frequency components encompassed within an inverted polarity and increased magnitude signal as defined in steps two and three of claim 8, based on preferential low frequency sound enhancement and sound producing device characteristics;

offsetting in time preferential low frequency components of said audio signals from higher frequency components such that signals concurrent in time at the beginning of the step are offset to be non-concurrent at the completion of the step by intervals of several milliseconds;

integrating the offset frequency signals with newly arriving audio signals which have completed the first step of claim 8;

continuously repeating the methodology of the prior three steps.

10. The dynamic sound enhancement method of claim 8, wherein;

reducing magnitude of high frequency components encompassed within an inverted polarity and increased magnitude signal of steps two and three of claim 8, based on preferential high frequency sound enhancement characteristics;

regulating the magnitude and shape of high frequency signals encompassed within said audio signal by controlling decay of high frequency signal magnitude based on preferential high frequency sound enhancement and sound producing device characteristics;

offsetting in time preferential high frequency components of said audio signals from lower frequency components such that signals concurrent in time at the beginning of the step are offset to be non-concurrent at the completion of the step by intervals of several milliseconds;

integrating said offset frequency signals with newly arriving audio signals which have completed the first step of claim 8;

continuously repeating the methodology of the prior four steps.

11. The dynamic sound enhancement method of claim 8, wherein;

regulating the magnitude and shape of low frequency signal components encompassed within an audio signal resulting from the combined interactions of the composite methods heretofore described within claims 8-10 by controlling decay of low frequency signal magnitude based on preferential low frequency sound enhancement and sound producing device characteristics.

\* \* \* \* \*